United States Patent [19]

Franke et al.

[11] Patent Number: 4,521,912
[45] Date of Patent: Jun. 4, 1985

[54] LOW POWER INDICATING CIRCUIT FOR A RADIO TRANSMITTER

[75] Inventors: Earnest A. Franke, Goode; Wayne J. Faulkenberry, Lynchburg, both of Va.

[73] Assignee: General Electric Company, Lynchburg, Va.

[21] Appl. No.: 502,679

[22] Filed: Jun. 9, 1983

[51] Int. Cl.³ .................... H04B 17/00; H04B 1/02
[52] U.S. Cl. ................................. 455/115; 455/126; 455/127
[58] Field of Search .................... 455/115–117, 455/127, 126; 330/207 P, 127; 340/539

[56] References Cited

U.S. PATENT DOCUMENTS

| | | | |
|---|---|---|---|
| 3,618,067 | 11/1971 | DeVale et al. | |
| 3,866,136 | 2/1975 | Augustin et al. | 455/117 |
| 4,021,807 | 5/1977 | Culpepper et al. | |
| 4,023,138 | 5/1977 | Ballin . | |
| 4,044,308 | 8/1977 | Stites et al. | 455/115 |
| 4,114,108 | 9/1978 | Faulkenberry et al. | 455/117 |
| 4,274,156 | 6/1981 | Trefney | 455/117 |
| 4,353,037 | 10/1982 | Miller | 455/117 |
| 4,392,245 | 7/1983 | Mitama | 455/117 |

*Primary Examiner*—Jin F. Ng
*Attorney, Agent, or Firm*—J. J. Williams; R. C. Lampe, Jr.

[57] ABSTRACT

Low power for a radio transmitter is indicated by an output power detector voltage falling below a low power reference voltage derived from an existing power control circuit.

5 Claims, 1 Drawing Figure

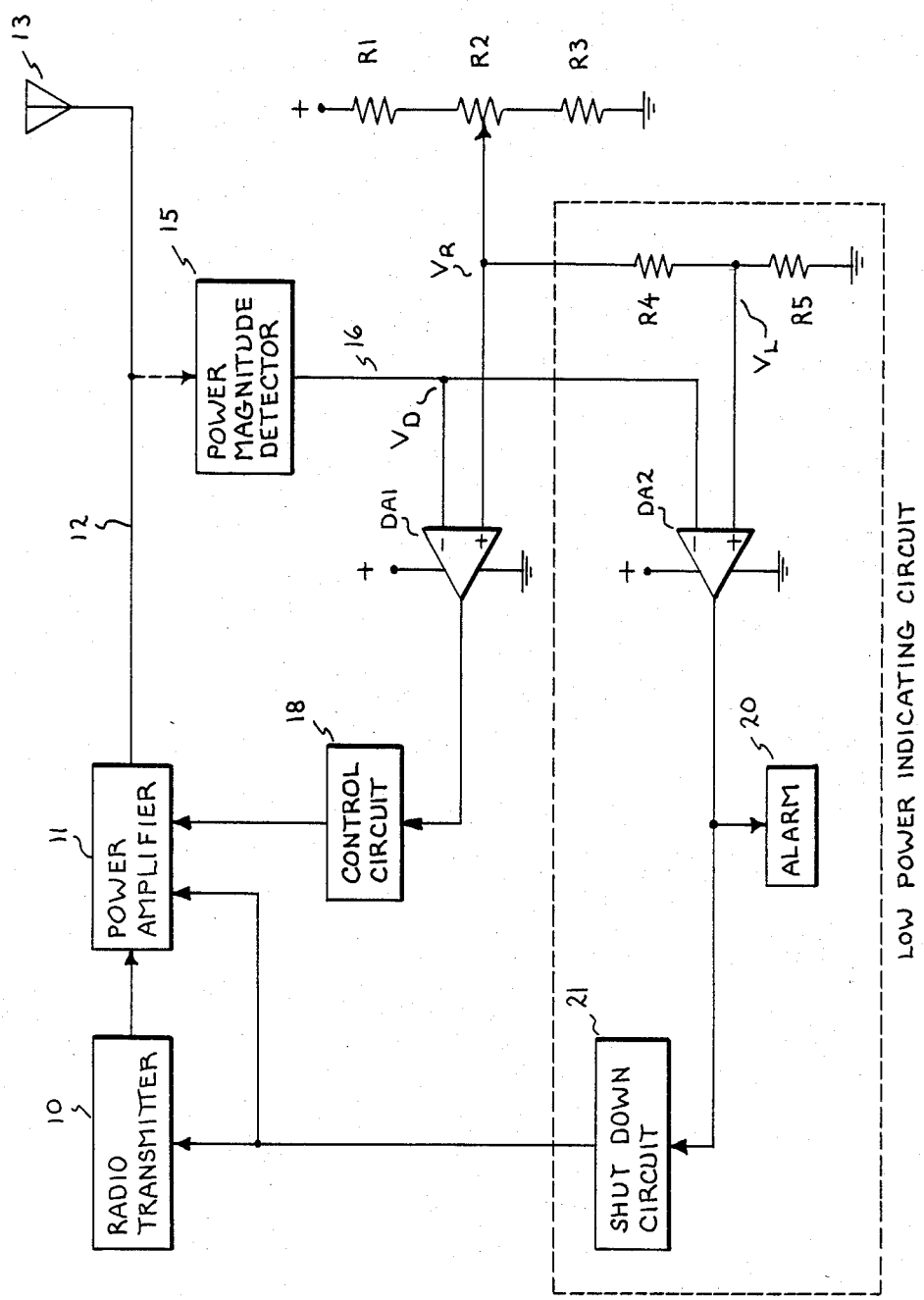

LOW POWER INDICATING CIRCUIT FOR A RADIO TRANSMITTER

BACKGROUND OF THE INVENTION

Our invention relates to a low power indicating circuit, and particularly to such a circuit for use with an existing power control circuit for a radio transmitter or the like.

In radio communication services, and particularly in mobile radio telephone services, it is desirable to know if the output power of a radio transmitter has fallen below a minimum acceptable value. Such a minimum acceptable value is essential, or at least desirable, in order to provide acceptable or high quality radio communication. Such a minimum acceptable value is also essential to protect a radio transmitter whose radio frequency power output may drop because of some circuit fault, such as thermal runaway of the power amplifier device. In addition, it is desirable to provide an indication when a radio transmitter output power has fallen below a minimum acceptable value. In the case of mobile radio telephone service, such an indication can be used to alert a user that his communication is not or may not be reaching a remote location, or can be used to automatically transfer the radio communication to another radio transmitter. Upon such a transfer, the radio transmitter whose output power has fallen can be taken out of service and its fault or problem corrected.

Radio transmitters are frequently provided with an output power control circuit which maintains the output power of a radio transmitter or the like at a selected magnitude. Hence, it is desirable to utilize as much of a power control circuit as possible to provide a low power indication.

SUMMARY OF THE INVENTION

Briefly, and in accordance with our invention, we provide a low power indicating circuit for use with an already existing output power control circuit having an output power detector, a reference circuit, and a feedback circuit coupled from the power detector and reference circuit back to the output power circuit. In accordance with our invention, we derive a first signal from the power detector, and derive a second signal of selected low power magnitude from the reference circuit. Means coupled to the derived signals provide an indication when the power detector signal is less than the selected low power signal. This indication is provided when the output power is less than the selected low power signal, and can be used in any way desired, such as an alarm to a user, or an automatic transfer of communication to another transmitter, or to some combination of uses.

BRIEF DESCRIPTION OF THE DRAWING

The subject matter which we regard as our invention is particularly pointed out and distinctly claimed in the claims. The structure and operation of our invention, as well as advantages, may be better understood from the following description given in connection with the accompanying drawing, in which:

The single FIGURE illustrates a preferred circuit diagram of a low power indicating circuit in accordance with our invention.

DESCRIPTION OF THE PREFERRED EMBODIMENT

Our low power indicating circuit is primarily intended to be used with a radio transmitter 10 or the like which typically includes an audio input circuit, an audio amplifier, and an exciter. The output of this transmitter 10 is applied to a power amplifier 11 which includes tubes or solid state devices to provide suitable amplification of the exciter output, usually modulated, for application over a transmission line 12 to an antenna 13. As known to persons skilled in the radio art, the power amplifier 11 must or should be adjusted to provide the desired RF output power to comply with FCC regulations and also to prevent overloading or damage to the amplifier devices, which are usually transistors. This is achieved by a power magnitude detector 15 which derives, either directly or by coupling, a small portion of the output power. The coupling is indicated by the dashed line between the line 12 and the input of the detector 15. As known in the art, the power magnitude detector rectifies this small amount of output power to provide a voltage $V_D$ whose magnitude is indicative of and usually directly related to the amount of output power. This voltage $V_D$ is supplied to an output line 16 which is connected to the minus (−) input of a differential amplifier DA1. The negative sign indicates that it is an inverting input. The output signal will be an inverted version of the signal on that input. The plus (+) input of the differential amplifier DA1 is provided with a reference voltage $V_R$. This reference voltage $V_R$ is provided by the movable tap of a power magnitude reference circuit comprised of three resistors R1, R2, R3 connected in series between a positive source of voltage and ground.

The output of the differential amplifier DA1 is coupled to the input of a control circuit 18, whose output is coupled in feedback fashion to the power amplifier 11. The control circuit 18 produces the appropriate signal or control function that adjusts the output power of the amplifier 11 in accordance with the feedback voltage supplied by the differential amplifier DA1.

The circuit as described thus far is known in the art, one example of such a circuit being shown in U.S. Pat. No. 4,114,108 issued Sept. 12, 1978. As known to persons skilled in the art, the control circuit 18 may vary the input power applied to the power amplifier 11 to control the output of the amplifier 11, or may vary the excitation applied to the amplifier 11 as a function of the output of the differential amplifier DA1.

In the operation of the circuit as described thus far, the movable tap on the resistor R2 is set at some point to provide a voltage which, by previous experience, causes the amplifier 11 to produce the desired output power. If the output power, as detected by the detector 15, exceeds the desired level, the differential amplifier DA1 produces a negative voltage which causes the control circuit 18 to reduce this power. Conversely, if the output power is below the desired level, the differential amplifier DA1 produces a positive voltage which causes the control circuit 18 to raise the output power.

In some applications, it is desirable or essential that the output power supplied by the amplifier 11 not be allowed to fall below a selected magnitude. This is necessary to make sure that sufficient transmitter output power is produced to provide the desired quality of radio communications. In accordance with our invention, we provide a low power indicating and control circuit which is shown enclosed in dashed lines in the FIGURE. As will become apparent, this indicating circuit provides the desired low power indication, but is also easily adapted to be used with the prior art power control circuit just described. Our low power indicating circuit utilizes a differential amplifier DA2 whose minus (−) input is also coupled to the output line 16 of the power magnitude detector 15. The plus (+) input of the differential amplifier DA2 is supplied with a low power voltage $V_L$. This voltage $V_L$ is provided at the junction of two resistors R4, R5 connected in series between the tap on the resistor R2 and ground. As will be explained, the relative magnitudes of the resistors R4, R5 determine the low power at which an indication is provided. This indication is produced at the output of the differential amplifier DA2 and may be used to actuate an alarm 20 that alerts a user that his transmitter is producing low power, and that actuates a shutdown or turn-off circuit 21 which turns off the radio transmitter 10 and power amplifier 11. In addition, the shutdown circuit 21 may, if desired, provide automatic switching of a given communication to another radio transmitter and power amplifier.

The magnitude of the resistors R4, R5 provide a voltage $V_L$ at the plus terminal (+) of the differential amplifier DA2 that is $R5/(R4+R5)$ times the voltage $V_R$ provided by the power magnitude reference circuit. This provides a constant fraction or ratio of the reference voltage $V_R$, regardless of where the setting for the tap on the resistor R2 is made. And as will be apparent to persons skilled in the art, if the detector voltage $V_D$ falls below the low power voltage $V_L$, the differential amplifier DA2 produces a positive voltage that indicates that the power is low, with appropriate alarms and operations being effected. However, if the detector voltage $V_D$ exceeds the low power magnitude voltage $V_L$, then the output of the differential amplifier DA2 is negative, and no alarm or indication is given.

It will thus be seen that we have provided a new and improved low power indicating circuit which provides assurance and control if the power of a radio transmitter falls below a selected magnitude. Our circuit is easily adapted for use with an existing power magnitude control circuit. While we have shown only one embodiment, persons skilled in the art will appreciate the modifications that may be made. The power magnitude detector 15, the voltage difference circuits DA1, DA2, the control circuit 18, the shutdown circuit 21, and the alarm 20 may take many different forms. Likewise, the low power voltage $V_L$ may be derived from a movable tap connected to the series of resistors R4, R5. Therefore, while our invention has been described with reference to a particular embodiment, it is to be understood that modifications may be made without departing from the spirit of the invention or from the scope of the claims.

What we claim as new and desire to secure by Letters Patent of the United States is:

1. A low power indicating circuit for a radio transmitter comprising:
   a. an output power magnitude detector for coupling to the output of said radio transmitter and producing a power magnitude signal related thereto;
   b. first means for providing a selectable power magnitude reference signal;
   c. second means coupled to said output power magnitude detector and to said first means for producing a feedback signal for application to said radio transmitter to control said output power magnitude as a function of the selected power magnitude provided by said first means;
   d. a low power magnitude circuit coupled to said first means for selecting a low power magnitude signal therefrom;
   e. third means coupled to said output power magnitude detector and to said low power magnitude circuit for producing a low power signal in response to said power magnitude signal being less than said low power magnitude signal;
   f. and means coupled between said third means and said radio transmitter for shutting off said radio transmitter in response to said low power signal.

2. A low power indicating circuit for a radio transmitter comprising:
   a. an output power magnitude detector for coupling to the output of said radio transmitter and producing a power magnitude signal related thereto;
   b. first means for providing a selectable power magnitude reference signal;
   c. second means coupled to said output power magnitude detector and to said first means for producing a feedback signal for application to said radio transmitter to control said output power magnitude as a function of the selected power magnitude provided by said first means;
   d. a low power magnitude circuit coupled to said first means for selecting a low power magnitude signal therefrom;
   e. third means coupled to said output power magnitude detector and to said low power magnitude circuit for producing a low power signal in response to said power magnitude signal being less than said low power magnitude signal;
   f. and means coupled to said third means for providing an alarm in response to said low power signal.

3. The indicating circuit of claim 2 wherein said low power magnitude circuit comprises a voltage divider circuit that provides a selected fraction of said reference signal.

4. The indicating circuit of claim 2 wherein said third means comprise a differential amplifier having one input connected to said output power magnitude detector and the other input connected to said low power magnitude circuit.

5. The indicating circuit of claim 3 wherein said third means comprise a differential amplifier having one input connected to said output power magnitude detector and the other input connected to said voltage divider circuit at the location which provides said selected fraction of said reference signal.

* * * * *